United States Patent
Le et al.

(10) Patent No.: US 6,549,081 B1
(45) Date of Patent: Apr. 15, 2003

(54) INTEGRATOR/ COMPARATOR CONTROL OF RING OSCILLATOR FREQUENCY AND DUTY CYCLE

(75) Inventors: Huy Le, San Jose, CA (US); Thomas Edward Kopley, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/626,583

(22) Filed: Jul. 27, 2000

(51) Int. Cl.$^7$ ................................................. H03B 1/00
(52) U.S. Cl. ...................... 331/57; 331/74; 331/177 R; 327/175; 327/172; 327/131; 327/132; 324/763
(58) Field of Search ................................ 331/57, 177 R, 331/74; 327/167, 182, 262, 176, 175, 172, 131, 132; 324/763, 73.1

(56) References Cited

U.S. PATENT DOCUMENTS

| | | | | |
|---|---|---|---|---|
| 4,531,096 A | * | 7/1985 | Yokoyama | 330/10 |
| 4,695,808 A | | 9/1987 | Cabaniss et al. | 331/57 |
| 4,789,976 A | * | 12/1988 | Fujishima | |
| 4,899,071 A | * | 2/1990 | Morales | |
| 5,625,288 A | | 4/1997 | Snyder et al. | 324/158.1 |
| 6,107,787 A | * | 8/2000 | Wand | 323/299 |

OTHER PUBLICATIONS

Eric S. Snyder, Donald G. Pierce, David V. Campbell and Scott E. Swanson; "If–Stressing Structures for Electromigration Testing to 500 MHz"; Proc. IEEE 1994 Int. Conference on Microelectronic Test Structures, vol. 7, Mar. 1994; pp. 62–67.

Eric S. Snyder, David V. Campbell, Scot E. Swanson and Donald G. Pierce; "Novel Self–Stressing Test Structures for Realistic High–Frequency Reliability Characterization"; 1993 IEEE/IRPS; pp. 57–65.

J. Winnerl, F. Neppl, A. Lill, G. Roska, W. Zatsch; "Ring Oscillator Structure for Realistic Dynamic Stress of Mosfets and Interconnects"; 1988 IEEE Proceedings on Microelectronic Test Structures, vol. 1, No. 1, Feb. 1988; pp. 56–60.

* cited by examiner

*Primary Examiner*—Arnold Kinkead

(57) ABSTRACT

A control circuit for a ring oscillator uses an integrator and a comparator. The integrator receives a square wave signal as an input and provides a triangular wave signal as an output. The comparator generates a second square wave signal by comparing the triangular wave signal and a reference voltage. Duty cycle for the ring oscillator can be modulated by varying the reference voltage. For one embodiment of the control circuit, signal frequency of the ring oscillator can be modulated by varying biasing current for the comparator to set slew rate of the comparator. For one embodiment of the control circuit, a resistor and a capacitor form a simple RC circuit for the integrator. For an alternative embodiment of the control circuit, a resistor and an amplifier with a capacitor in a negative feedback loop form an active RC circuit for the integrator. For one embodiment of the control circuit, the comparator is an inverting comparator. A ring oscillator employing the control circuit can be formed using a plurality of inverters coupled in series with the control circuit. A test system can be formed by coupling an output buffer and the ring oscillator to a device-under-test and monitoring the ring oscillator frequency and device characteristics.

4 Claims, 4 Drawing Sheets

INTEGRATOR/COMPARATOR CONTROL OF RING OSCILLATOR FREQUENCY AND DUTY CYCLE

BACKGROUND OF THE INVENTION

1. Field of the Invention

The present invention relates to integrated circuit devices, and, in particular, to ring oscillator circuits for such devices.

2. Description of the Related Art

Ring oscillators have been used as a development vehicle for a variety of purposes, from process development to SPICE model validation to reliability qualification. See for example, Winnerl et al., International Conference on Microelectronic Test Structure, 1988. In a typical reliability qualification test circuit, a way to generate an on-chip AC signal is often desired. Ring oscillator (RO) circuits have been used to provide an on-chip digital waveform generator to stress/test metal lines for electromigration, to test oxide capacitors for gate oxide integrity, for hot-carrier stressing in devices, and for examining other process reliability related issues.

Two parameters of interest of a ring oscillator output are the frequency of the signal ($f_{osc}$) and the duty cycle (DC) of the waveform. To acquire multiple frequencies in an on-chip test circuit, one would typically have to design many different ROs with different numbers of stages to vary the frequency. To overcome this need for multiplicity, Snyder et al. proposed the current-starved inverter approach as a way to implement a frequency modulation capability and thereby achieve continuous frequency range from a single RO. See for example, Snyder et al., International Conference on Microelectronic Test Structure, 1994. Although beneficial, the current-starved inverter design still lacks an ability to control variability of the waveform duty cycle, and an ability to implement this capability easily.

Thus, it can be seen that modern ring oscillator techniques impose duty cycle and oscillation frequency limits upon IC-based reliability test circuitry, and hinder the use of these testers in many applications.

Therefore, there is an unresolved need for an improved ring oscillator technique that can easily modulate and control duty cycle and oscillation frequency for IC-based reliability test circuitry.

SUMMARY OF THE INVENTION

A ring oscillator technique is described that can easily modulate and control duty cycle and oscillation frequency for IC-based reliability test circuitry.

A control circuit for a ring oscillator uses an integrator and a comparator. The integrator receives a square wave signal as an input and provides a triangular wave signal as an output. The comparator generates a second square wave signal by comparing the triangular wave signal and a reference voltage. Duty cycle for the ring oscillator can be modulated by varying the reference voltage.

For one embodiment of the control circuit, signal frequency of the ring oscillator can be modulated by varying biasing current for the comparator to set slew rate of the comparator.

For one embodiment of the control circuit, a resistor and a capacitor form a simple RC circuit for the integrator. For an alternative embodiment of the control circuit, a resistor and an amplifier with a capacitor in a negative feedback loop form an active RC circuit for the integrator.

For one embodiment of the control circuit, the comparator is an inverting comparator.

A ring oscillator employing the control circuit can be formed using a plurality of inverters coupled in series with the control circuit.

A test system can be formed by coupling an output buffer and the ring oscillator to a device-under-test and monitoring the ring oscillator frequency and device characteristics.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–5. Those skilled in the art will readily appreciate that the detailed description given herein with respect to these figures is for explanatory purposes, however, because the invention extends beyond these limited embodiments.

Figure 1:
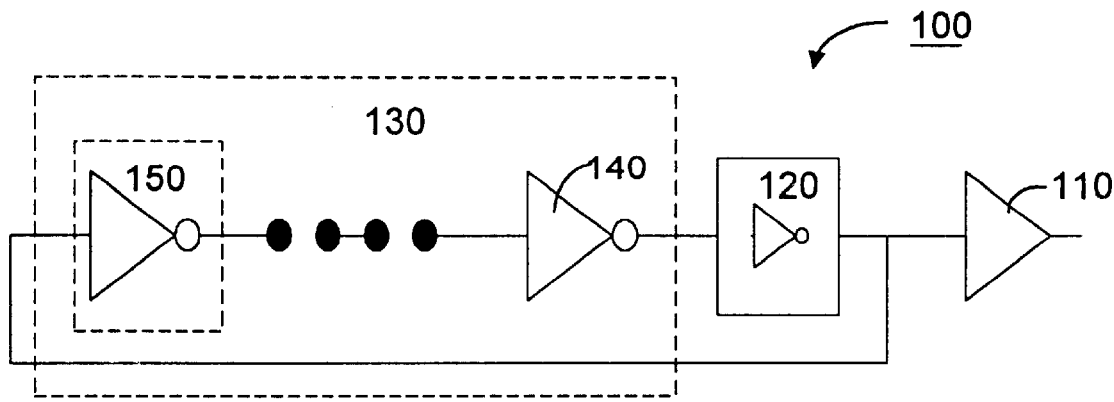
FIG. 1 shows the structure of a test system that incorporates ring oscillator control circuitry according to the invention.

FIG. 1 shows the structure of a test system 100 that incorporates ring oscillator control circuitry according to the invention. FIG. 1 shows a schematic of a test-circuit ring oscillator (RO) which, for this embodiment, is composed of three parts. The first part is an inverter chain 130 which, for this embodiment, has an even number of inverter stages.

For the embodiment shown, there are actually an odd number of inverter stages 140 but control circuit 150 also includes an inverter function thereby replacing one of the inverter stages of inverter chain 130. For an alternative embodiment, control circuit 150 is part of inverter chain 130 but does not include an inverter function. For this alternative embodiment, there are an even number of inverter stages 140.

Figure 4A:
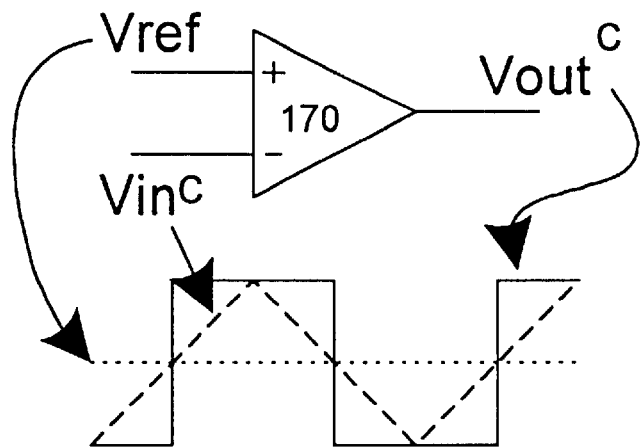
FIGS. 4A–B are diagrams illustrating embodiments of a comparator circuit for the ring oscillator control circuitry according to the present invention.
Figure 4B:
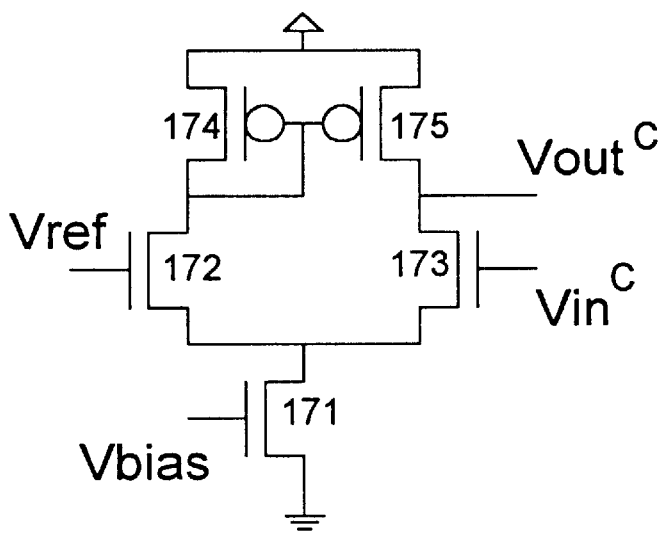
Figure 5:
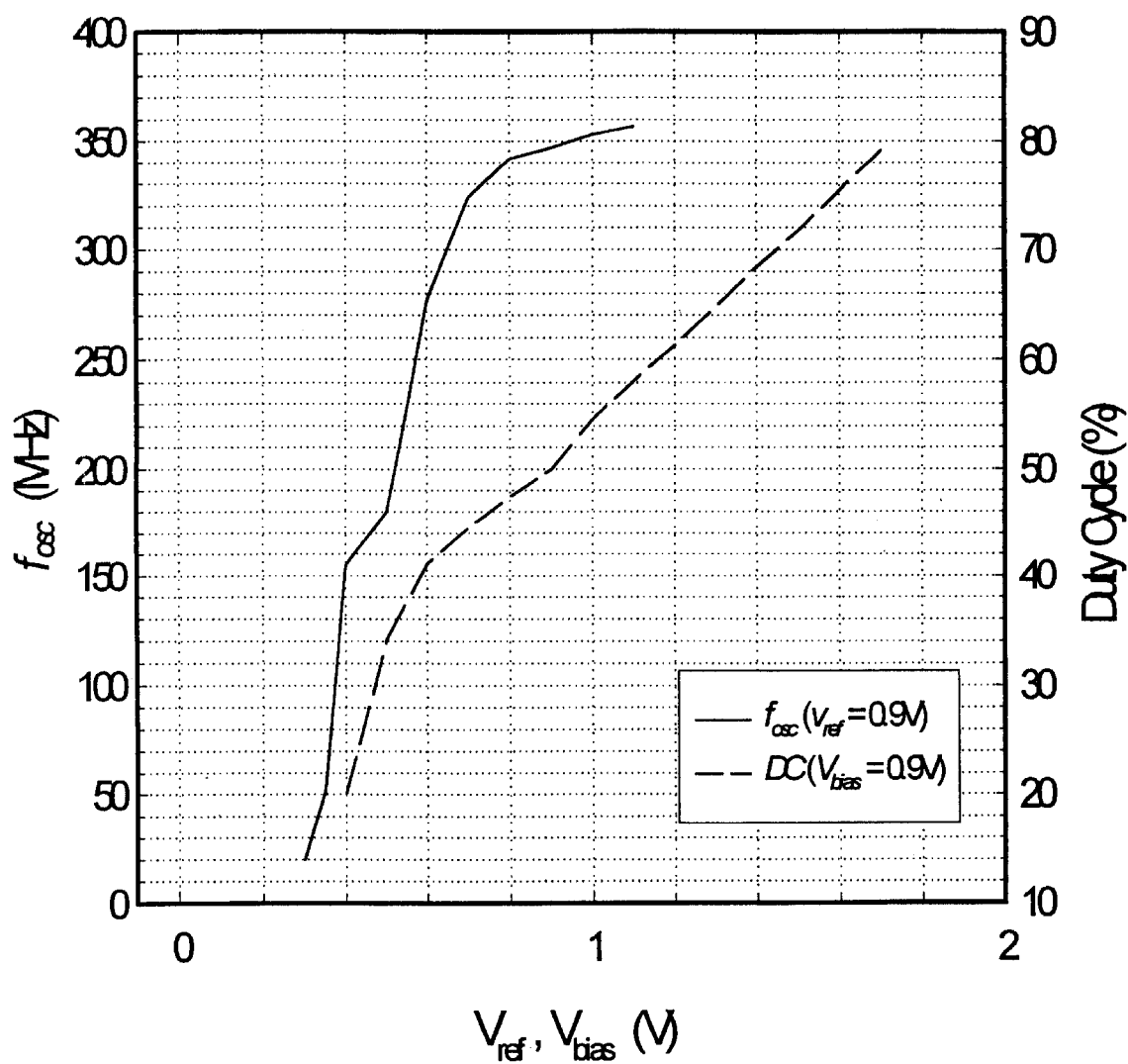
FIG. 5 is a diagram illustrating a range of possible oscillation frequency and duty cycle values that can be achieved by employing the ring oscillator control circuitry according to an embodiment of the present invention.

Control circuit 150 operates according to the present invention employing integrator-comparator circuitry. The integrator-comparator approach of the present invention allows an easy and independent control of $f_{osc}$ and duty cycle modulation capability in a ring oscillator through the setting of Vref and Vbias (see, for example, FIGS. 4A–B). In a finite range, the possible range of frequency and duty cycle achievable with this integrator-comparator design is quite linear as shown in FIG. 5. Although there are various ways of implementing an integrator and a comparator, the underlying concept relies on two basic principles:

Integration of a square wave into a triangular wave to allow signal comparison; and Comparing of the triangular wave with a reference voltage to set the relative duty cycle at the output.

The comparator can also serve to set the charging and discharging time (slew rate) at the output, hence affecting the signal frequency. Operation of control circuit 150 according to the present invention will be discussed in greater detail below in connection with FIGS. 2–5.

The second part of FIG. 1 is a device-under-test 120 (here, a single stage inverter). The device-under-test (DUT) has the capability to be probed and to thereby characterize device current and voltage. See for example, Jiang et al., International Conference on Microelectronic Test Structure, 1997.

The third part of FIG. 1 is an output buffer 110 that can be used to monitor the frequency of the ring oscillator. Alternatively, if this RO is used as a on-chip signal generator, output buffer 110 can be used to drive other DUTs. The use of a ring oscillator circuit is well known in the art and will not be discussed further except as it relates to the ring oscillator control circuit of the present invention.

Figure 2:
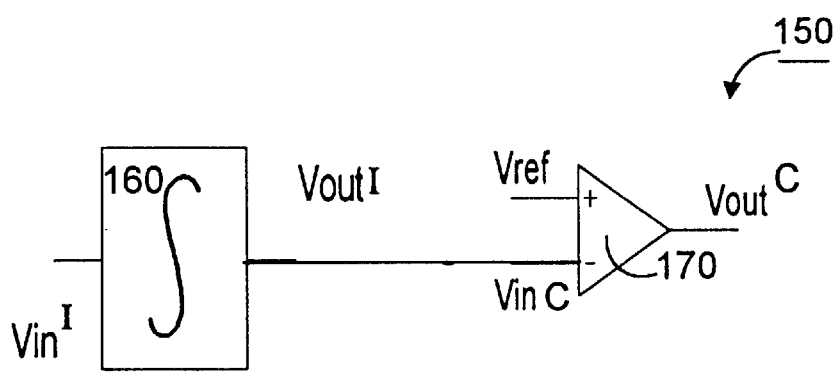
FIG. 2 shows details of the ring oscillator control circuitry of the test system shown in FIG. 1.

As mentioned previously, there are several ways to vary $f_{osc}$ at the output of a RO, among which include varying the number of stages, N, in the inverter chain, or replacing one or more inverters with a current-starved inverter. FIG. 2 shows details of the present invention ring oscillator control circuitry 150 of the test system 100 shown in FIG. 1. For the embodiment of FIG. 2, the $f_{osc}$ and DC modulation control capability of the RO is achieved by inverter 150 (in FIG. 1) which is an integrator 160, followed by an inverting comparator 170.

Figure 3A:
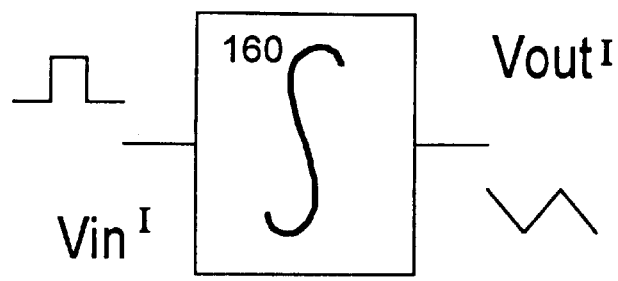
FIGS. 3A–C are diagrams illustrating embodiments of an integrator circuit for the ring oscillator control circuitry according to the present invention.
Figure 3B:
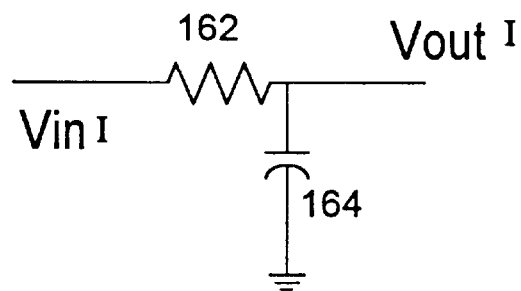
Figure 3C:
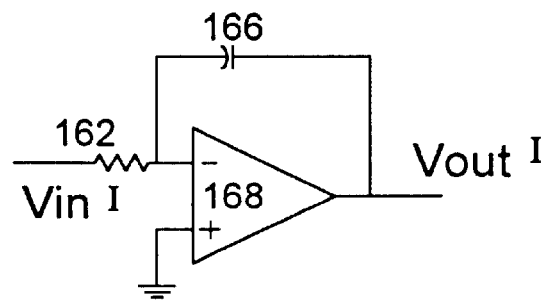

FIGS. 3A–C are diagrams illustrating embodiments of an integrator circuit 160 for the ring oscillator control circuitry 150 according to the present invention. Similarly, FIGS. 4A–B are diagrams illustrating embodiments of a comparator circuit 170 for the ring oscillator control circuitry 150 according to the present invention The functionality of the integrator 160 is shown in FIG. 3A. Square wave signal, VinI, is integrated by integrator circuit 160 to form triangle wave output signal, VoutI.

Note that, as is common practice for those skilled in the art, although various signals will be described herein as square wave signals or triangle wave signals, it is to be understood that such signals are only perfectly square or triangular in the ideal. Thus, for example, a signal that inflects and therefore does not have a perfectly linear sloped rise or fall, would still be considered a triangle wave so long as its shape was generally triangular.

Similarly, a signal that does not have instantaneous rise or fall time, or that overshoots or undershoots its respective maximum and minimum values, would still be considered a square wave so long as its shape was generally square. Note also that square is used in the sense common in the art, i.e., that "corners" of the signal are approximately right angles and not necessarily that all "sides" have the same length.

FIG. 3B illustrates an RC implementation of integrator circuit 160. Resistor 162 and capacitor 164 together integrate square wave signal, VinI, to form triangle wave output signal, VoutI.

FIG. 3C illustrates an alternative embodiment of integrator circuit 160. In FIG. 3C, an amplifier 168 with capacitor 166 in the negative feedback loop are substituted to form an active RC implementation of integrator circuit 160. Resistor 162, amplifier 168 and capacitor 166 together integrate square wave signal, VinI, to form triangle wave output signal, VoutI.

FIGS. 4A–B are diagrams illustrating embodiments of a comparator circuit 170 for the ring oscillator control circuitry 150 according to the present invention. The compara-tor circuit 170 (shown in FIG. 4A) is designed to take the triangular wave, VoutI, from the integrator 160 as input, VinC. Comparator circuit 170 compares the triangular wave VinC against a (fixed, but possibly settable) reference voltage $V_{ref}$. Comparator circuit 170 produces a binary output (square wave VoutC) depending on the result of the comparison. FIG. 4B is a five transistor (171–175) embodiment of comparator circuit 170. With the schematic implementation of comparator circuit 170 shown in FIG. 4B:

VoutC=high if $VinC<V_{ref}$,

VoutC=low otherwise

Because $V_{ref}$ is controlled externally, the trigger point of the comparator 170 can used to set when the comparator will toggle between 1 and 0, thus affecting the duty cycle of the waveform. Although comparator 170 of FIG. 4B is an inverting comparator, for an alternative embodiment, a non-inverting comparator (and an additional, separate inverter circuit) can be employed.

Furthermore, bias signal, $V_{bias}$, of the comparator circuit 170 sets the current that flow through the transistors, controlling the charging and discharging time of $V_{out}C$ and affecting the $f_{osc}$ of the signal.

In summary, the integrator-comparator implementation of the present invention has three factors that contribute to its ring oscillator control behavior:

Integrator RC time constant: this value is fixed in the simple RC implementation (and does not affect the waveform), but can be controlled in the active version.

Comparator trigger point: this trigger point sets the relative delay time within one period for the comparator to toggle between 1 and 0, thus affecting the duty cycle of the waveform.

Comparator biasing current: by setting this current to an appropriate value, the charging and discharging time of the comparator can be set, thus affecting the frequency of the waveform.

With the (passive) integrator and (inverting) comparator circuit 150, a 41-stage ring oscillator embodiment of FIG. 1 was found to exhibit the expected behavior as previously analyzed. Shown in FIG. 5 are frequency range and the duty cycle ranges that were achieved with this integrator-comparator circuit embodiment.

For this integrator-comparator circuit, the range of $f_{osc}$ and DC were found to be more linear than prior circuit designs. These ranges can be increased in alternative embodiments. For example, for one alternative embodiment one can implement the active RC integrator design and move the functionality of the comparator biasing current to the integrator. This will allow the design to have a wider range of possible $f_{osc}$ and DC.

Thus, by replacing one inverter stage in a ring oscillator with a integrator-comparator inverter (or, alternatively adding a non-inverting integrator-comparator control circuit), one can make a single ring oscillator ring at multiple frequencies ranging from its maximum allowable frequency to an arbitrarily low frequency. Furthermore, the duty cycle of the waveform can also be controlled independently from the $f_{osc}$. This approach to designing ring oscillators eliminates the need of having many ring oscillators with different number of stages and fanout to simulate different type of AC waveforms a device may experience.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A control circuit for a ring oscillator, the control circuit comprising:

an integrator to receive a first square wave signal as an input and provide a triangular wave signal as an output; and a comparator to generate a second square wave signal by comparing the triangular wave signal and a reference voltage, whereby duty cycle for the ring oscillator can be modulated by varying the reference voltage, and wherein signal frequency of the ring oscillator can be modulated by varying biasing current for the comparator to set slew rate of the comparator.

2. A control circuit for a ring oscillator, the control circuit comprising:

an integrator to receive a first square wave signal as an input and provide a triangular wave signal as an output;

a comparator to generate a second square wave signal by comparing the triangular wave signal and a reference voltage, whereby duty cycle for the ring oscillator can be modulated by varying the reference voltage;

a plurality of inverters serially connected, receiving the second square wave signal, having an output; and a device-under-test serially connected to the output of the plurality of inverters.

3. A control circuit as defined in claim 2, further comprising;

the ring oscillator having a ring oscillator frequency; and an output buffer coupled to the device-under-test, the output buffer being used to monitor the ring oscillator frequency.

4. A control method for a ring oscillator, the control method comprising:

integrating a first square wave signal received as an input to provide a triangular wave signal as an output; and generating a second square wave signal by comparing the triangular wave signal and a reference voltage, whereby duty cycle for the ring oscillator can be modulated by varying the reference voltage, wherein the step of comparing is performed by a comparator, wherein signal frequency of the ring oscillator can be modulated by varying biasing current for the comparator to set slew rate of the comparator.

* * * * *